United States Patent
Vetter et al.

(10) Patent No.: US 11,342,168 B2
(45) Date of Patent: May 24, 2022

(54) CATHODIC ARC EVAPORATION WITH PREDETERMINED CATHODE MATERIAL REMOVAL

(71) Applicant: Oerlikon Surface Solutions AG, Pfaffikon, Pfaffikon (CH)

(72) Inventors: Joerg Vetter, Bergisch gladbach (DE); Markus Willach, Bergisch Gladbach (DE)

(73) Assignee: OERLIKON SURFACE SOLUTIONS AG, PFAFFIKON, Pfaffikon (CH)

( * ) Notice: Subject to any disclaimer, the term of this patent is extended or adjusted under 35 U.S.C. 154(b) by 181 days.

(21) Appl. No.: 16/485,564

(22) PCT Filed: Feb. 14, 2018

(86) PCT No.: PCT/EP2018/053724
§ 371 (c)(1),
(2) Date: May 19, 2020

(87) PCT Pub. No.: WO2018/149894
PCT Pub. Date: Aug. 23, 2018

(65) Prior Publication Data
US 2020/0402781 A1    Dec. 24, 2020

Related U.S. Application Data

(60) Provisional application No. 62/458,631, filed on Feb. 14, 2017.

(51) Int. Cl.
*C23C 14/32* (2006.01)
*H01J 37/34* (2006.01)
*H01J 37/32* (2006.01)

(52) U.S. Cl.
CPC ........ *H01J 37/3402* (2013.01); *C23C 14/325* (2013.01); *H01J 37/32055* (2013.01)

(58) Field of Classification Search
None
See application file for complete search history.

(56) References Cited

U.S. PATENT DOCUMENTS

| | | | |
|---|---|---|---|
| 5,298,136 A * | 3/1994 | Ramalingam ..... | H01J 37/32055 204/192.38 |
| 2010/0101947 A1* | 4/2010 | Nishimura ............ | H01J 37/345 204/298.16 |

FOREIGN PATENT DOCUMENTS

| | | |
|---|---|---|
| DE | 10127012 A1 | 12/2002 |
| EP | 1382711 A1 | 1/2004 |
| WO | 8901699 | 2/1989 |

OTHER PUBLICATIONS

International Search Report dated Aug. 23, 2018 in parent PCT application PCT/EP2018/053724.

(Continued)

*Primary Examiner* — Jason Berman
(74) *Attorney, Agent, or Firm* — Polson Intellectual Property Law, PC; Christopher Sylvain; Margaret Polson (57) ABSTRACT

The present invention relates to a method for the evaporation of a cathode by means of cathodic arc evaporation, wherein the focal spot of the arc is forced to a predetermined track on the cathode surface by means of temporally and spatially controllable magnetic fields, wherein a predetermined removal of material of the cathode surface is produced. The invention also relates to a device for carrying out the method according to the invention.

19 Claims, 3 Drawing Sheets

(56) References Cited

OTHER PUBLICATIONS

Written Opinion of the International Searching Authority dated Aug. 23, 2018 in parent PCT application PCT/EP2018/053724.

* cited by examiner

CATHODIC ARC EVAPORATION WITH PREDETERMINED CATHODE MATERIAL REMOVAL

The present invention relates to a method for the evaporation of a cathode by means of cathodic arc evaporation in which the arc spot of the arc is forced onto a predetermined track on the cathode surface by means of temporally and spatially controllable magnetic fields in which a predetermined material removal from the cathode surface is produced. The invention also relates to a device for carrying out the method according to the invention.

PRIOR ART

In cathodic arc evaporation (also referred to below as arc evaporation, where in the context of the present invention, cathodic arc evaporation=arc evaporation) of materials that are used as a cathode, the arc spot (also called the spot or cathode spot) is usually unpredictable when no magnetic field is used. Particularly in the case of graphite materials, the arc spot moves in an extremely random and slow fashion in comparison to metallic materials. In such cases, the spot often remains at a position on the surface of the graphite material, which is to be evaporated, for so long that a deep hole is produced in the graphite material and as a result, the arc extinguishes.

For example in their article "Vacuum Arc Cathode Spot Movement on Various Kinds of Graphite Cathodes" in Plasma Sources Sci. Technol. 5 (1996) 349-355, Kandah et al. describe how a cathode spot moves more slowly on a graphite cathode than on a cathode composed of metallic material, that it can even become anchored and as a result, can burn into the graphite material. In the same article, Kandah et al. report that by using powerful magnetic fields, which can be kept temporally and spatially constant, it is possible to reduce the occurrence of macroparticles in layers that are produced by means of cathodic arc evaporation of graphite cathodes. They explain that these powerful magnetic fields cause an increase in the speed of the arc spot and thus a reduction of the exposure time of the heat of the arc spot in the cathode spot region, which results in a reduced generation of macroparticles from the graphite cathode. For the experiments they conducted, Kandah et al. reported the average spot speed as the spot travel divided by the arc duration. An external, stationary magnetic field parallel to the cathode surface was used to move the spot backward on the graphite cathode surface, as is typical of arcs in a vacuum that are under the influence of transverse magnetic fields. It was observed that the spot behaves very differently on different graphite types, both in terms of the spot speed and in terms of the removal profile.

In the following, magnetic fields that are kept temporally and spatially constant are also referred to as "temporally and spatially stationary magnetic fields" or simply as "stationary magnetic fields."

Setting an optimal removal profile through the use of such a stationary magnetic field, however, turns out to be virtually impossible on large, flat cathodes. In this connection, for example, this affects already circular active cathode surfaces, which have a diameter of a few centimeters i.e. 2 cm or more.

Other authors have also recently reported on methods for controlling the movement of the cathode spot on graphite cathodes by using magnetic fields.

For example in their article "Control of Cathodic Arc Spot Motion Under External Magnetic Field" in Vacuum 91 (2013) 20-23, Liuhe Li et al. report on the influence of different strengths of temporally and spatially stationary magnetic fields, arc current, gas pressure, and surface morphology on the movement and dynamics of the cathode spot on rectangular graphite cathodes. The magnetic field used is generated through a combination of permanent magnets and electromagnetic coils. This temporally and spatially stationary magnetic field, however, acts so extensively on a track that it results in a nonuniform material removal of the graphite cathode.

In this context, in their article "Magnetic Field Influence on the Shape of Eroding Surface of Graphite Cathodes," in Problems of Atomic Science and Technology, 2002, no. 5 Series: Plasma Physics (8), pp. 142-144, Aksenov et al. report on the influence of temporally and spatially stationary magnetic fields on the shape of the eroded surface of a graphite cathode during the arc evaporation. In this connection in particular, experiments were conducted to study the gas pressure and the arc current. Aksenov et al. also mention that the speed of the movement of a cathode spot on graphite is approximately 2 to 3 orders of magnitude lower than on metal. In the edge region of cathodes, despite the optimization of the magnetic fields, an undefined removal (also called erosion) of the cathode material is observed.

The use of a plurality of stationary magnetic fields in order to force an arc on a metallic cathode to move is also known from the prior art. In this connection, in DE4008850A1, Vetter describes that selectively changing peripheral magnetic fields can be used to prevent the arc from going below the cathode surface that is to be evaporated.

The inventors, however, have determined that these prior solutions, which include the control of external magnetic fields, have up to this point only enabled a limited selective adjustment of removal profiles (also called erosion profiles).

Object of the Present Invention

The stated object of the present invention is to provide a method for the evaporation of a cathode by means of cathodic arc evaporation, in which a predetermined material removal of the cathode surface is produced, particularly in the case of graphite cathodes materials that are to be evaporated.

Attainment of the Object According to the Present Invention—Description of the Present Invention The inventors have proven that surprisingly, the above-described disadvantages of the prior solutions according to the prior art can be ideally overcome with cathodic arc evaporation, particularly of graphite materials, using temporally and spatially controllable magnetic fields, where the erosion of the cathode material (also referred to below as removal, where erosion=removal in the context of the present invention) is selectively adjusted with the aid of temporally and spatially controllable magnetic fields.

DETAILED DESCRIPTION OF THE PRESENT INVENTION

In the context of the present invention, the expression "temporally and spatially controllable magnetic field" refers to such a magnetic field that has magnetic field lines whose properties can be selectively altered in one or more locations, at least during a part of the application duration of the magnetic field.

Likewise in the context of the present invention, the expression "stationary magnetic field" refers to such a magnetic field, particularly an external one, which has magnetic field lines whose properties are not temporally and spatially controllable during the application duration of the magnetic field, i.e. it is not possible to alter the track of the arc spot during the cathodic arc evaporation in such a way that the cathode location at which erosion is occurring can be altered by means of a change to the properties of the magnetic field lines.

The invention will be explained in greater detail below based on drawings and exemplary embodiments:

For example, if a graphite target (also referred to below simply as a target) with a given graphite quality is used as a cathode in a vacuum coating chamber in order to evaporate the graphite target by means of arc evaporation and thus to deposit a carbon layer on a surface of a substrate placed in the vacuum coating chamber, according to the invention, it is possible to adjust temporally and spatially controllable tunnel-shaped guidance magnetic fields in order, for example assuming a constant removal rate R for the given graphite quality, to feed the same quantity of ampere seconds to different locations of the target (also referred to below simply as the cathode) in a manner that is temporally integral.

In this connection, the symbol "$R_{Graph}$" is used to designate the removal rate of the graphite material in microgram/ampere second (μg/As).

The invention will now be explained based on FIG. 1, which shows two guidance magnetic fields (M1 and M2) that are adjusted according to the invention.

According to the present invention, a first suitable guidance magnetic field M1 is adjusted in order to erode a first region of the cathode surface. This produces a first erosion path W1. The first erosion path W1 then corresponds to the track of the arc spot when the first guidance magnetic field M1 is produced and remains adjusted.

The first erosion path W1 and the first integral speed v1 of the spot, which result with this first guidance magnetic field M1, are measured with suitable methods, e.g. visual inspection.

Likewise, at least one second guidance magnetic field M2 is adjusted, which results in the erosion of a second region of the cathode surface. This produces a second erosion path W2, which corresponds to the track of the arc spot when the second guidance magnetic field M2 is produced and remains adjusted. The second integral speed v2 and the second erosion path, which result with this second guidance magnetic field M2, are likewise measured.

If the first erosion path W1 has a first length L1 and the second erosion path W2 has a second length L2, and if L2>L1, then assuming the same integral spot speed for both erosion paths (v1=v2), the time t2 for a trip along the second erosion path W2 is greater than the time t1 for a trip along the first erosion path, i.e. t2>t1.

This therefore yields the following:
v1=L1/t1=v2=L2/t2 for the same target material, assuming the same given quality of target material,
i.e. vi−1=Li−1/ti−1=vi=Li/ti, and where i=1 to n, with n≥2 and where i is a whole number and n is also a whole number.

The erosion E for the respective regions is defined as E=R*t, where Ei=R*ti and if i=n, then En=R*tn= $E_{n-i}=R*t_{n-i}$ ..., assuming a constant removal rate R.

EXAMPLE 1 ACCORDING TO THE INVENTION

In this example, the current applied to the arc evaporator was 100 A, the measured residence time of the spot in the first region was t1=40 s and the measured erosion rate was R1=18 μg/As, where R1=R, assuming a constant removal rate.

The erosion E1 in the first region can then be calculated as follows:

$$E1=R*t1=R1*t1=18 \text{ μg/As}*100 \text{ A}*40 \text{ s}=72000 \text{ μg}$$

The magnetic means for producing the guidance magnetic fields in the cited example were adjusted so that circular or almost circular erosion paths are produced. The diameter D1 of the first erosion path was approx. 8 cm. Because of the circular shape of the track of the spot, the length L1 of the first track of the arc spot was calculated as follows:

$$L1=\pi*D1 \approx 25 \text{ cm}$$

On the one hand, this yields an integral spot speed v1=L1/t1 of approx. 38 cm/min and a specific erosion relating to the erosion path of Esp1=E1/L1 (erosion divided by the erosion path) of 2880 g/cm.

If the integral spot speed in the first proximity is assumed to be constant, then with a guidance field M1 that produces a circular erosion path with a smaller diameter D1, the travel time must be shorter if the same specific erosion is to be adjusted. For example, with a different erosion path with half the diameter as compared to the example cited above, then one would have a diameter D1=4 cm (instead of D1=8 cm, as indicated above) and this would yield a travel time (the time it takes to travel through the track once) t1 of approx. 19 s.

In another embodiment of the invention, a method can be carried out so that a plurality of magnetic fields Mi can be produced, where i=1 to n, with the respective exact travel time ti for each adjusted guidance magnetic field Mi is calculated and adjusted as described above.

This linear approach enabled the adjustment of a plurality of erosion paths Wi and in this way, it was surprisingly possible to achieve very good erosion results. In other words, an amazingly homogeneous erosion of the cathode surface was achieved. This method according to the invention also surprisingly made it possible to significantly reduce the number of droplets in the carbon layers produced in this instance.

But carrying out a method according to the invention (such as the method according to the invention described above) also requires the use of a suitable device.

Figure 2:
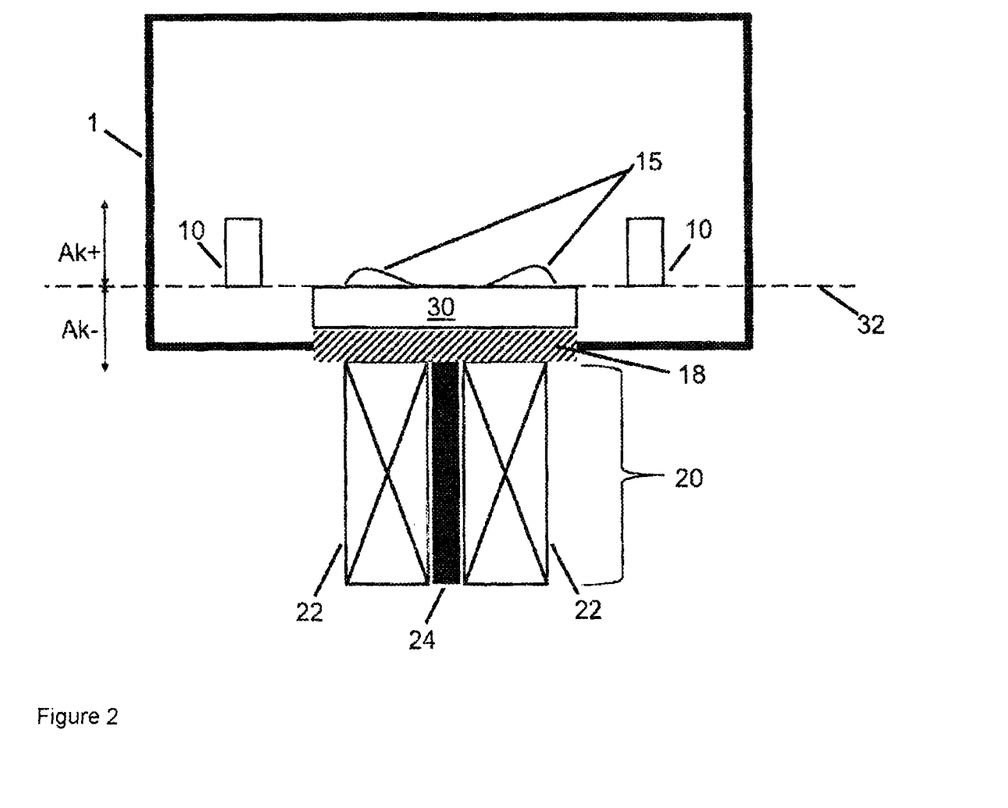
FIG. 2: shows a device for carrying out the method according to the invention

Such a suitable device is shown in FIG. 2. The device comprises an arc evaporator (30, 10, 18, 20) with inner magnetic means 10 that are positioned inside the vacuum coating chamber 1 and are used to produce an inner magnetic field, said inner magnetic means 10 encompassing the cathode 30. To produce an outer magnetic field, an outer magnetic means 20 is provided behind the cathode 30 outside the vacuum coating chamber 1. The outer magnetic means in this example consists of a coil 22 and a core 24. The core 24 can consist of a ferritic material or of a suitable permanent magnetic material. The erosion locations in the different regions of the cathode surface can then be adjusted from seconds to minutes with this device, taking into account the integral travel speed of the spot.

In EP2140476B1, Vetter describes an arc evaporator, which has inner ring magnets and outer ring magnets that make it possible to adjust an outer permanent magnetic field that can be adjusted in the axial direction, the inner ring magnets being arranged around the cathode. This permanent magnetic field, however, is a stationary magnetic field, which cannot be temporally and spatially changed during the deposition of a layer by means of arc evaporation of the cathode and as a result, would lead to an unsuitable control of the cathode evaporation of certain cathodes materials. Such a stationary magnetic field is particularly unsuitable for graphite evaporation when achievement a uniform erosion of the cathode surface is required and is likewise unsuitable when a burning-in of the cathode spot at a position on the cathode surface must be avoided.

According to one embodiment of the present invention, the above-mentioned evaporator is modified and configured according to the invention so that instead of the outer ring magnets, at least one suitable coil 22, preferably with an iron core 24, is used to control a temporal and spatial adjustment of the erosion surface in a simple way. It is thus possible to control the adjustment of the erosion surfaces, for example in order to adjust a first erosion surface in a selected region of the cathode surface by adjusting a first defined, temporally constant current feed (in amperes) of the coil 22, and in order to adjust another erosion surface in another region of the cathode surface by adjusting another defined, temporally constant current feed of the coil 22. By adjusting the duration of a defined, constant current feed of the coil 22, it is possible to define the duration of the residence time (from seconds to minutes) of the cathode spot on the respective erosion surface. It is then possible, therefore, to control the erosion in each respective selected region of the cathode surface.

According to a preferred embodiment of the present invention, the above-described method is used for adjusting the local erosion in the respective regions of the cathode surface, the method comprising the following step:

Production of an inner magnetic field, which is preferably, but not exclusively, produced with permanent magnets and is arranged in circular fashion around the cathode, it being possible for the relative position to be situated in the cathode plane 32, but also spaced a certain distance Ak+ in front of the cathode plane or a certain distance Ak− below the cathode plane (for example see the depiction of the distances Ak+ and Ak− in FIG. 2), for example, up to 10 mm above the cathode or up to a distance no greater than 70% of the magnet length below it. Preferably, this inner magnetic field generates largely vertical magnetic field lines on the cathode surface, whose density increases toward the edge of the cathode.

This inner magnetic field is preferably produced so that it concentrates the travel behavior essentially in the middle of the cathode.

Between the cathode 30 and the outer magnetic means 20, there is a cathode-accommodating plate 18, which has, for example, a cooling function and comprises a power supply.

The inner magnetic field and the magnetic polarization of the coil are preferably adjusted so that on the cathode surface, a guidance magnetic field is produced, which is preferably a tunnel-shaped guidance magnetic field that is temporally and spatially controllable. For circular cathodes, the travel radius of the arc (also referred to as the travel radius of the spark or spot) is changed. In the case of an inner magnetic field, which encompasses the cathode and consists of permanent magnets, the pole that is depicted in the direction of the cathode and the polarization of the coil are embodied as having opposite polarization. If the field of the inner magnet system in the direction of the cathode is the north pole, then the coil is polarized so that its south pole points in the direction of the cathode or vice versa. It is thus possible to produce a tunnel-shaped guidance magnetic field.

To implement the above-described example 1, a disc-shaped graphite cathode with a circular surface to be evaporated was used, which had a diameter of 100 mm and a thickness of 15 mm.

The present invention, however, can also be used for other shapes of cathode surfaces that are to be evaporated, taking into account the specific geometrical circumstances. For example, it is possible to use elliptical, rectangular, and other shapes for the cathode surfaces that are to be evaporated. There may possibly, however, be limitations to the cathode utilization.

Preferably, evaporation cathodes with circular evaporation surfaces are used.

According to another preferred embodiment of the present invention, the above-described device, which has been modified according to the invention, can be used to carry out a method according to the invention, with the guidance magnetic field being altered by means of the outer coil in order to apply a tunnel-shaped guidance magnetic field M. The temporal alteration of the magnetic field through the adjustment of the coil in this context is, as already mentioned above, preferably made by means of a change in the current strength (current feed) of the coil. The current strength is dependent, for example, on the number of windings and the type of core 24.

The above-mentioned tunnel-shaped guidance magnetic field can then be adjusted by operating the coil with different currents so that different guidance magnetic fields or a number n of guidance magnetic fields $M_i$ with i=1 to n are produced (where i is a whole number, n is also a whole number, and n is ≥2), wherein each guidance magnetic field $M_i$ guides the arc spot of the arc on a respective track in order to produce a corresponding erosion path $W_i$.

These tracks of the spot or erosion paths can, for example, be generated concentrically and in circular fashion relative to the cathode surface.

If the respective erosion path $W_i$ is circular and is centered in the middle of the cathode surface, then the erosion paths should each have a different diameter $D_i$; for example if n=4, then $D_1 > D_2 > D_3 > D_4$.

Figure 1:
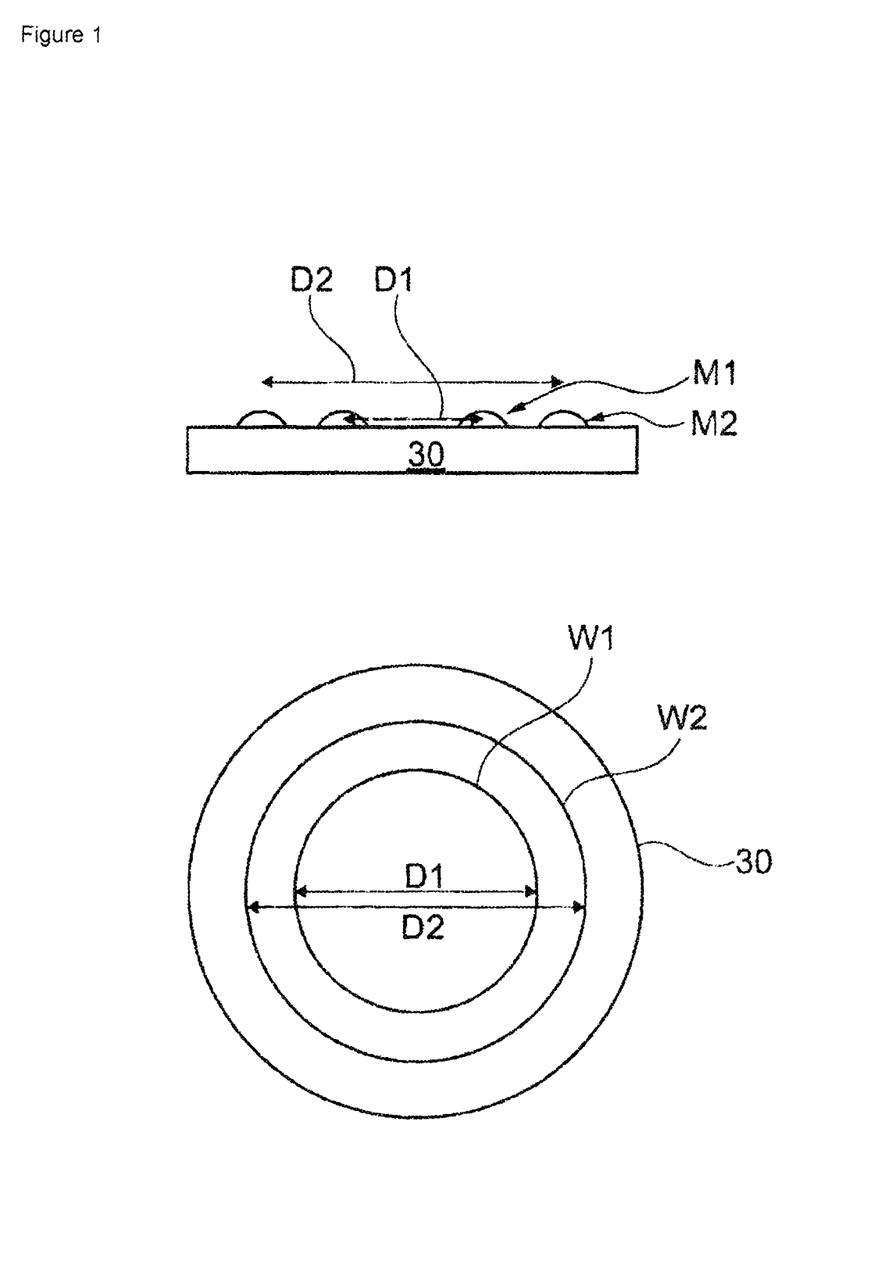
FIG. 1: shows two tunnel-shaped magnetic fields that are adjusted in the manner according to the invention (labeled M1 and M2 in FIG. 1) and the resulting erosion distances (labeled W1 and W2 in FIG. 1) on a cathode 30; the erosion paths are each circular with corresponding diameters (labeled D1 and D2 in FIG. 1).

A tunnel-shaped guidance magnetic field is shown by way of example in FIGS. 1 and 2.

EXAMPLE 2

Figure 3:
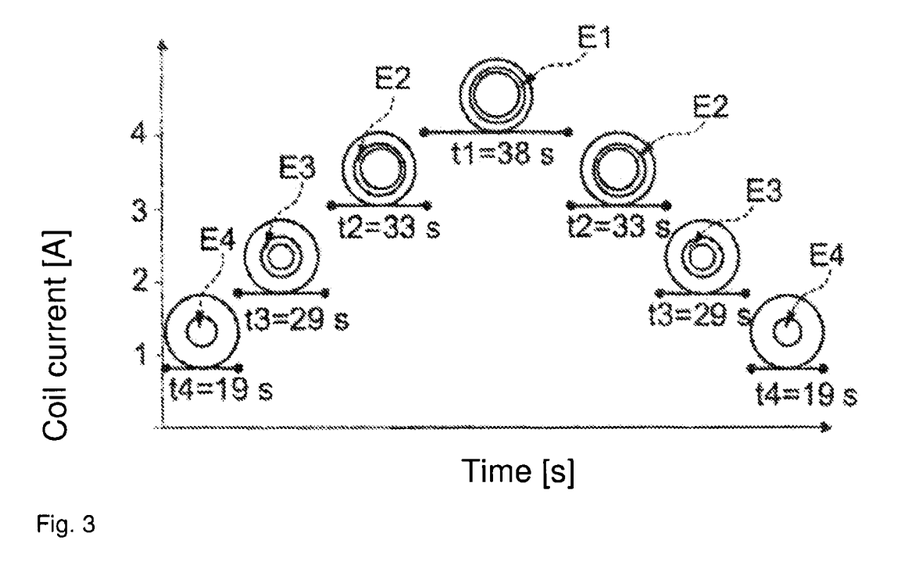
FIG. 3: shows the erosion paths and eroded regions that result from the use of a method according to the invention in accordance with example 2 below.

The following parameters were used to carry out example 2, also see FIG. 3.

arc current 70 A graphite cathode with a diameter of 100 mm

The maximum coil current was chosen to prevent the arc from traveling across the cathode edge.

To adjust a first guidance magnetic field M1, a coil current of 4 A was adjusted, a diameter D1=8 cm was measured, and the corresponding time span of t1=38 s was measured, see example 1.

To adjust a second guidance magnetic field M2, a coil current of 3 A was adjusted, a diameter D2=7 cm was measured, and the time span according to the invention of t2=33 s was calculated.

To adjust a third guidance magnetic field M3, a coil current of 2 A was adjusted, a diameter D3=6 cm was measured, and the time span according to the invention of t3=29 s was calculated.

To adjust a fourth guidance magnetic field M4, a coil current of 1 A was adjusted, a diameter D4=4 cm was measured, and the time span according to the invention of t4=19 s was calculated.

The switching of the coil current for generating the guidance magnetic fields M1 to M4 can, for example, be carried out in a temporally integral fashion with the same frequency (e.g. sequentially one after another, i.e. first M1 during a first time t1, then M2 during a second time t2, then M3 during a third time t3, and then M4 during a time t4, after that, then M1 again during a time 1, and so on).

Testing was performed to find out what happens with the movement of the arc spot of the arc when a coil current of 0 A is used, i.e. no tunnel-shaped guidance magnetic field is produced. It was observed that the arc could only travel stochastically in the middle of the cathode and there was the risk of a local burn-in. It was determined that in the short term, as a rule in the neighborhood of a few tens of seconds, this non-tunnel-shaped magnetic field can be advantageous in a sequential switching of the guidance magnetic fields M1 to M4, e.g. in the ignition procedure of the arc.

The switching can also be carried out so that multiples of the time ti, where ti=1 to n, are controlled, for example factor 2, where this must take place in the temporal integral. The method can then be embodied as follows, for example:

M1 during t1, followed by M2 during t2, followed by M3 during t3, followed by M4 during 2×t4, followed by M3 during t3, followed by M1 during t1, followed by M2 during t2, and so on. As a result, all of the erosion paths are traveled through with an equal degree of frequency, averaged over time.

These examples, however, should in no way be seen as limitations to the method according to the invention. The person skilled in the art can adapt the sequential switching of the guidance magnetic fields as needed, taking into account the desired erosion profiles on the cathode surface.

The inventors have determined that it is advantageous if the distance A between two adjacent tracks is at least 1 mm, but preferably 3 to 10 mm.

In addition to the above-described inventive solution for producing temporal and spatial erosion profiles in the defined region, other solutions can be used for producing the suitable tunnel-shaped guidance magnetic field, it being possible to calculate the respective time in seconds to minutes based on the measured integral speed of the arc and the segment to be eroded.

It is, however, essential to the invention that a tunnel-shaped guidance magnetic field is produced, it being possible to also use suitable magnetic means that are known to the person skilled in the art with a suitable polarization that is also known to the person skilled in the art.

For example, an inner and outer coil or a plurality of permanent magnets or a combination of coils and permanent magnets can be used.

By way of example, FIG. 2 shows an arrangement with inner magnetic means (inside the vacuum chamber, where the cathode surface to be evaporated is located) and outer magnetic means (behind the cathode) for producing an inner magnetic field and an outer magnetic field, the interaction of these magnetic fields producing a tunnel-shaped guidance magnetic field that is temporally and spatially changeable.

As part of the present invention, a number of tests were performed in which graphite cathodes (also referred to as graphite targets) with different graphite qualities and densities in the range from 1.6 to 1.9 g/cm$^3$ were used for cathodic arc evaporation.

The arc discharge (also called spark discharge) was started by means of a mechanical trigger. But other types of ignition devices can be used, for example electrical or laser-equipped ones. The magnetic field intensities were selected based on the desired travel range of the spark discharge. Typically, magnetic field intensities were selected so that the vertical magnetic field intensities of the controllable tunnel-shaped magnetic field lay in the range from 0.5 to 30 mT. The processes were carried out in stable fashion both in a vacuum and with the use of Ar as a process gas as well as with a supply of reactive gases $O_2$, $N_2$, $C_2H_2$, and/or $H_2$. Typically, the adjusted partial pressures of the reactive gases was 0.1 to 1 Pa. The maximum process pressures with Ar were 5 Pa. An outstanding control of the erosion could be achieved under all processing conditions.

With cathodic arc evaporation of graphite cathodes by means of this controlled graphite evaporation according to the present invention, both graphitic layers and hard amorphous layers (DLC layers) of types a-C, ta-C, a-C:H, and a-C:N were deposited, with the hardest layers (ta-C) having hardnesses of up to 80 GPa under suitable process conditions of the layer deposition.

In addition to being used for cathodic arc evaporation of pure graphite cathodes, this method according to the invention can also be used for cathodic arc evaporation of alloyed graphite cathodes, for example alloyed graphite cathodes, which have at least one alloying element, the at least one alloying element preferably being one of the following elements: Si, B, F, Ti, Cr, Mo, W, Al, and Cu. The method according to the invention, however, can also be used for arc evaporation of cathodes composed of other materials such as copper.

When alloyed graphite cathodes are used, the graphite cathode should preferably include the alloying element or the sum of the alloying elements so that the concentration of the alloying elements in atomic percent lies in a range from 0.1 to 49 at %, preferably from 1 to 25 at %.

The present invention specifically discloses:

A method for the evaporation of a cathode by means of a cathodic arc evaporation process in a vacuum chamber in which an arc is ignited and the movement of the arc spot of the arc is forced on a predetermined track on the evaporation cathode surface by means of a guidance magnetic field, where inner magnetic means inside the vacuum chamber and outer magnetic means outside the vacuum chamber are used to produce at least one inner magnetic field and one outer magnetic field, the guidance magnetic field being a tunnel-shaped guidance magnetic field, which is produced by the interaction, characterized in that the tunnel-shaped guidance magnetic field can be changed and during the performance of the cathodic arc evaporation process, at least two different guidance magnetic fields (M1, M2) are produced and wherein the method comprises the following steps:

Production of the first tunnel-shaped guidance magnetic field (M1), which is used during a first travel time t1 to guide the arc spot of the arc on a first track on the cathode surface that is to be evaporated, wherein a first erosion path (W1) with a length (L1) is produced in a first region of the cathode surface, and wherein the first travel time (t1) corresponds to the time that the arc spot needs to travel the complete length (L1) of the first erosion path (W1) one time.

Alteration of the properties of the first guidance magnetic field in order to adjust a second tunnel-shaped guidance magnetic field (M2) that is different from the first and that is used during a second travel time (t2) to guide the arc spot of the arc on a second track on the cathode surface that is to be evaporated, wherein a second erosion path (W2) with a length (L2) is produced in a second region of the cathode surface, and wherein the second travel time (t2) corresponds to the time that the arc spot needs to travel the complete length (L2) of the second erosion path (W2) one time.

Performance of the cathodic arc evaporation process, wherein during the total duration of the cathodic arc evaporation process $t_{tot}$, the first guidance magnetic field (M1) is adjusted during a switch-on time $t_{on}2$ and the second guidance magnetic field (M2) is adjusted during a switch-on time $t_{on}2$, where $t_{on}1 \geq t1$, $t_{on}2 \geq t2$, and $t_{Tot} \geq t_{on}1 + t_{on}2$ and where t1 and t2 last from seconds to minutes.

According to the present invention, the properties of the first tunnel-shaped guidance magnetic field can be changed n times in order to adjust a number n of tunnel-shaped guidance magnetic fields Mi, where n is a whole number, n≥2, i is a whole number, and i=1 to n, wherein each tunnel-shaped guidance magnetic field results in a different track for the guidance of the arc spot of the arc during a second travel time ti and in this way, a different erosion path Wi with a corresponding length Li is produced, wherein the travel time ti corresponds to the time that the arc spot needs to travel the complete length Li of the corresponding erosion path Ei once, and wherein each $t_{on}i \leq ti$, ti lasts from seconds to minutes, and the entire duration of the cathodic arc evaporation process $t_{Tot} = \Sigma ti$ of ti=1 to ti=n.

$t_{on}1$, $t_{on}2$ or possibly $t_{on}i$ can be an integral multiple of the same factor k≥1, where $t_{on}1=k*t1$, $t_{on}2=k*t2$, or possibly $t_{on}i=k*ti$.

Preferably, the properties of the tunnel-shaped guidance magnetic fields are selected so that at least two erosion paths are circular.

Preferably, the at least two circular erosion paths should be centered in the middle of the cathode surface that is to be evaporated.

Preferably, the distance between two adjacent circular erosion paths should be at least 1 mm, preferable 3 to 10 mm.

Preferably, in order to produce the inner magnetic field and/or to produce the outer magnetic field, at least one coil is used and to produce the different tunnel-shaped guidance magnetic fields, the current that flows through the coil is changed.

According to a preferred embodiment of the present invention, the cathode surface that is to be evaporated is composed of a graphite material or a graphite material that is alloyed with other elements.

Preferably, the above-mentioned coil is an outer coil (22), which has an iron core (24).

Preferably, the cathode is plate-shaped and has a circular surface to be evaporated.

Preferably, the inner magnetic field is produced so that the travel behavior is concentrated essentially in the middle of the cathode.

Preferably, each guidance magnetic field M1, M2, and possibly Mi, respectively during a switch-on time $t_{on}1$, $t_{on}2$ and possibly $t_{on}i$, is switched on sequentially in such a way that a homogeneous erosion of the cathode surface to be evaporated is achieved.

According to another preferred embodiment of the present invention, $t_{on}1$, $t_{on}2$ and possibly $t_{on}i$ is an integral multiple of a separate, not necessarily equal, factor of k1, k2, or possibly ki, respectively, where $t_{on}1=k1*t1$, $t_{on}2=k2*t2$, or possibly $t_{on}i=ki*ti$.

Preferably, all of the erosion paths Ei are circular.

Preferably, all of the circular erosion paths Ei are centered in the middle of the cathode surface to be evaporated.

The invention claimed is:

1. A method for the evaporation of a cathode by means of a cathodic arc evaporation process in a vacuum chamber in which an arc is ignited and the movement of the arc spot of the arc is forced on a predetermined track on the evaporation cathode surface by means of a guidance magnetic field, where inner magnetic means inside the vacuum chamber and outer magnetic means outside the vacuum chamber are used to produce at least one inner magnetic field and one outer magnetic field, the guidance magnetic field being a tunnel-shaped guidance magnetic field, which is produced by the interaction of the magnetic fields, characterized in that the tunnel-shaped guidance magnetic field can be changed and during the performance of the cathodic arc evaporation process, at least two different guidance magnetic fields (M1, M2) are produced and wherein the method comprises the following steps:

production of the first tunnel-shaped guidance magnetic field (M1), which is used during a first travel time t1 to guide the arc spot of the arc on a first track on the cathode surface that is to be evaporated, wherein a first erosion path (W1) with a length (L1) is produced in a first region of the cathode surface, and wherein the first travel time (t1) corresponds to the time that the arc spot needs to travel the complete length (L1) of the first erosion path (W1) one time;

alteration of the properties of the first guidance magnetic field in order to adjust a second tunnel-shaped guidance magnetic field (M2) that is different from the first and that is used during a second travel time (t2) to guide the arc spot of the arc on a second track on the cathode surface that is to be evaporated, wherein a second erosion path (W2) with a length (L2) is produced in a second region of the cathode surface, and wherein the second travel time (t2) corresponds to the time that the arc spot needs to travel the complete length (L2) of the second erosion path (W2) one time; and performance of the cathodic arc evaporation process, wherein during the total duration of the cathodic arc evaporation process $t_{tot}$, the first guidance magnetic field (M1) is adjusted during a switch-on time $t_{on}1$ and the second guidance magnetic field (M2) is adjusted during a switch-on time $t_{on}2$, where $t_{on}1 \geq t1$, $t_{on}2 \geq t2$, and $t_{Tot} \geq t_{on}1 + t_{on}2$.

2. The method of claim 1, wherein the properties of the first tunnel-shaped guidance magnetic field can be changed n times in order to adjust a number n of tunnel-shaped guidance magnetic fields Mi, where n is a whole number, n≥2, i is a whole number, and i=1 to n, wherein each tunnel-shaped guidance magnetic field results in a different track for the guidance of the arc spot of the arc during a second travel time ti and in this way, a different erosion path Wi with a corresponding length Li is produced, wherein the travel time ti corresponds to the time that the arc spot needs to travel the complete length Li of the corresponding erosion path Wi once, and wherein each $t_{on}i \leq ti$, and the entire duration of the cathodic arc evaporation process $t_{Tot} = \Sigma ti$ of ti=1 to ti=n.

3. The method of claim 1, wherein each of $t_{on}1$ and $t_{on}2$ is an integral multiple of the same factor $k \geq 1$, where $t_{on}1 = k*t1$ and $t_{on}2 = k*t2$.

4. The method of claim 1, wherein at least two erosion paths are circular.

5. The method of claim 4, wherein the at least two circular erosion paths are centered in the middle of the cathode surface that is to be evaporated.

6. The method of claim 5, wherein the distance between two adjacent circular erosion paths is at least 1 mm.

7. The method of claim 1, wherein in order to produce the inner magnetic field and/or to produce the outer magnetic field, at least one coil is used and to produce the different tunnel-shaped guidance magnetic fields, the current that flows through the coil is changed.

8. The method of claim 1, wherein the cathode surface that is to be evaporated is composed of a graphite material or a graphite material that is alloyed with other elements.

9. The method of claim 8, wherein the coil is an outer coil which has an iron core.

10. The method of claim 1, wherein the cathode is plate-shaped and has a circular surface to be evaporated.

11. The method of claim 1, wherein the inner magnetic field is produced so that the travel behavior is concentrated essentially in the middle of the cathode.

12. The method of claim 1, wherein each guidance magnetic field M1 and M2, respectively during a switch-on time $t_{on}1$ and $t_{on}2$, is applied sequentially in such a way that a homogeneous erosion of the cathode surface to be evaporated is achieved.

13. The method of claim 1, wherein each of $t_{on}1$ and $t_{on}2$ is an integral multiple of a separate, not necessarily equal, factor of k1 and k2, respectively, where $t_{on}1 = k1*t1$ and $t_{on}2 = k2*t2$.

14. The method of claim 2, wherein all of the erosion paths Wi are circular.

15. The method of claim 14, wherein all of the circular erosion paths Wi are centered in the middle of the cathode surface to be evaporated.

16. The method of claim 2, wherein each of $t_{on}1 \ldots t_{on}i$ is an integral multiple of the same factor $k \geq 1$, where $t_{on}1 = k*t1 \ldots t_{on}i = k*ti$.

17. The method of claim 2, wherein each guidance magnetic field M1 ... Mi, respectively during a switch-on time $t_{on}1 \ldots t_{on}i$, is applied sequentially in such a way that a homogeneous erosion of the cathode surface to be evaporated is achieved.

18. The method of claim 2, wherein each of $t_{on}1 \ldots t_{on}i$ is an integral multiple of a separate, not necessarily equal, factor of k1 ... ki, respectively, where $t_{on}1 = k1*t1 \ldots t_{on}i = ki*ti$.

19. The method of claim 6, wherein the distance between two adjacent circular erosion paths is 3 to 10 mm.

* * * * *